United States Patent
Jha et al.

(10) Patent No.: US 8,502,343 B1
(45) Date of Patent: Aug. 6, 2013

(54) NANOELECTRIC MEMRISTOR DEVICE WITH DILUTE MAGNETIC SEMICONDUCTORS

(75) Inventors: Rashmi Jha, Toledo, OH (US); Jorhan Ordosgoitti, Toledo, OH (US); Branden Long, Toledo, OH (US)

(73) Assignee: The University of Toledo, Toledo, OH (US)

( * ) Notice: Subject to any disclaimer, the term of this patent is extended or adjusted under 35 U.S.C. 154(b) by 0 days.

(21) Appl. No.: 13/298,601

(22) Filed: Nov. 17, 2011

Related U.S. Application Data

(60) Provisional application No. 61/414,572, filed on Nov. 17, 2010.

(51) Int. Cl.
*H01L 29/00* (2006.01)

(52) U.S. Cl.
USPC ............... 257/537; 257/536; 257/E45.002; 257/E45.003

(58) Field of Classification Search
USPC ............. 257/536, 537, E45.002, E45.003
See application file for complete search history.

(56) References Cited

U.S. PATENT DOCUMENTS

| | | | |
|---|---|---|---|
| 6,815,744 B1 | 11/2004 | Beck et al. | |
| 7,426,128 B2 | 9/2008 | Scheuerlein | |
| 7,579,611 B2 | 8/2009 | Lam et al. | |
| 7,586,774 B2 | 9/2009 | Joo et al. | |
| 7,602,633 B2 | 10/2009 | Choi et al. | |
| 7,846,807 B2 * | 12/2010 | Tang et al. | 438/385 |
| 7,985,962 B2 | 7/2011 | Bratkovski et al. | |
| 7,994,557 B2 | 8/2011 | Baek et al. | |
| 8,012,793 B2 | 9/2011 | Lam et al. | |
| 8,093,575 B2 | 1/2012 | Xia et al. | |
| 8,144,498 B2 * | 3/2012 | Kumar et al. | 365/148 |
| 8,310,857 B2 * | 11/2012 | Goux et al. | 365/148 |
| 8,343,813 B2 * | 1/2013 | Kuse et al. | 438/133 |
| 2008/0079029 A1 | 4/2008 | Williams | |
| 2008/0090337 A1 | 4/2008 | Williams | |
| 2011/0204475 A1 * | 8/2011 | Rui et al. | 257/532 |
| 2012/0113706 A1 * | 5/2012 | Williams et al. | 365/148 |
| 2012/0176831 A1 * | 7/2012 | Xiao et al. | 365/148 |

OTHER PUBLICATIONS

Zaleska, "Doped-TiO2: A Review", Bentham Science Publishers Ltd., 2008, pp. 157-164, vol. 2.

* cited by examiner

*Primary Examiner* — Ida M Soward
(74) *Attorney, Agent, or Firm* — MacMillan, Sobanski & Todd, LLC

(57) ABSTRACT

A nanoelectric memristor device includes a first electrode and a layer of oxygen-vacancy-rich metal oxide deposited upon a surface of the first electrode. A layer of oxygen-rich/stochiometric metal oxide is deposited upon a surface of the oxygen-vacancy-rich metal oxide layer that is opposite from said first electrode. At least one of the oxygen-vacancy-rich metal oxide and oxygen-rich/stochiometric metal oxide layers is doped with one of a magnetic and a paramagnetic material. A second electrode is adjacent to a surface of the oxygen-rich/stochiometric metal oxide layer that is opposite from the oxygen-rich/stochiometric metal oxide layer.

9 Claims, 6 Drawing Sheets

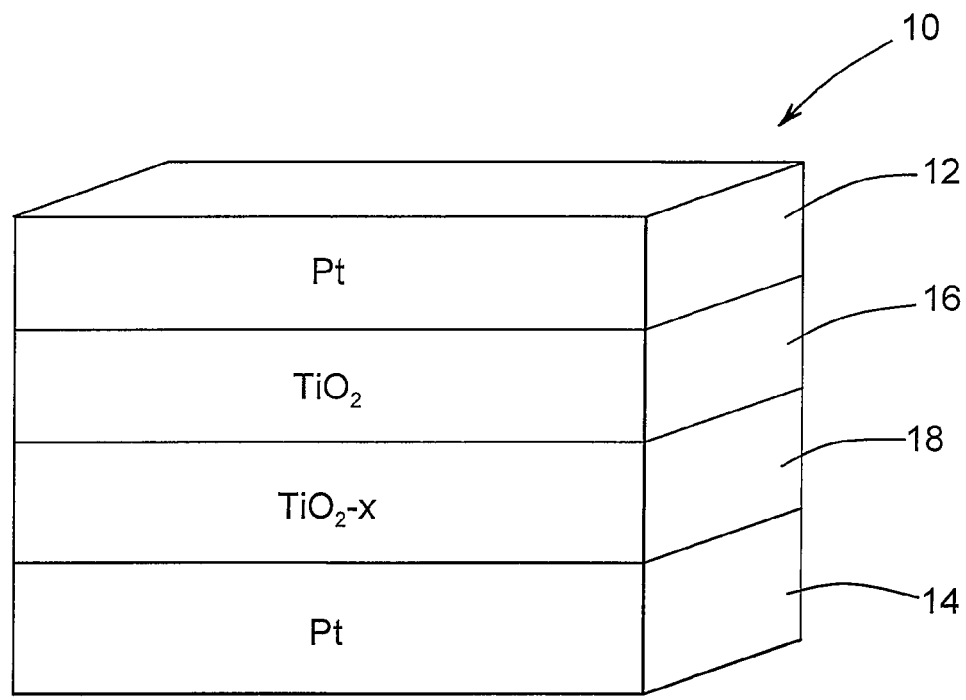
F I G. 1
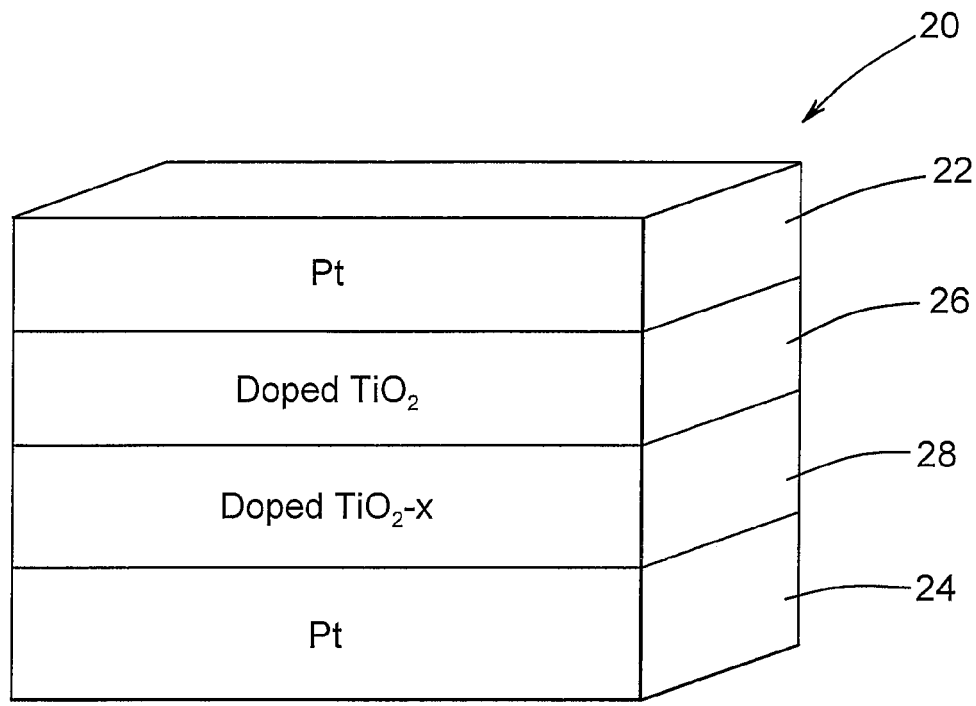
F I G. 2

NANOELECTRIC MEMRISTOR DEVICE WITH DILUTE MAGNETIC SEMICONDUCTORS

This application claims the benefit of U.S. Provisional Application No. 61/414,572, filed Nov. 17, 2010, the disclosure of which is incorporated herein by reference.

STATEMENT REGARDING FEDERALLY SPONSORED RESEARCH OR DEVELOPMENT

Not applicable.

BACKGROUND OF THE INVENTION

This invention relates in general to electronic nonvolatile memory devices and in particular to nanoelectronic memristor devices.

The logic and memory device market has generally been following Moore's Law for the last three decades by greatly increasing the number of components that can be provided on an integrated circuit chip. One apparent impact of this densification of solid state electronic components on a chip can be seen in consumer electronic products market, where there has been a large increase in the functionality of consumer electronic products such as, for example, cell phones, gaming consoles, iPhones, and other all-in-one devices, in recent years. In the area of high performance computing, the densification of electronic components on an integrated circuit chip has enabled multi-core computer architectures, thus enabling the next generation of petascale to exascale computing.

Nanoelectronic memristive devices offer a new way to store data by modulating the conductance on a two-terminal device. The conductance of the device is non-volatile in nature, which means that the conductive state of the device is preserved even when the power is turned-off. Current memory technologies use three terminals devices based on flash memory to form the non-volatile storing units. The flash memory devices are predicted to approach their fundamental limits by the year 2020. Memristors, on the other hand, are two terminal devices that require less physical space to build the data storing cells. They can be integrated into cross-bar memory architecture, which will allow for a more dense data storage and increase capacity over current memory technologies. There are a number known memristor devices. One such device is composed of two layers of titanium dioxide film, one of which has a slight depletion of oxygen atoms. The oxygen vacancies act as charge carriers, with the depleted layer having a much lower resistance than the non-depleted layer. When an electric field is applied, the oxygen vacancies drift, changing the boundary between the high-resistance and low-resistance layers and thereby changing the total resistance of the device. Thus, the resistance of the device as a whole is dependent on how much charge has been passed through it in a particular direction, which is reversible by changing the direction of current.

Referring now to the drawings, there is shown in FIG. 1, a prior art nanoelectronic memristor device 10 that has two electrodes 12 and 14 that can be made of metals such as, but not limited to, tungsten, platinum, and ruthenium. Between the electrodes 12 and 14 are two intermediate layers 16 and 18 that form the device. One layer 16 is made of titanium dioxide, while the other layer 18 can be any oxygen-vacancy-rich titanium oxide.

However, current memristor devices, such as the one shown in FIG. 1 offer a relatively low ON/OFF conductance ratio, making it difficult to design large scale integration memory devices for low power applications using this technology. Additionally, the switching speed is much slower in memristor devices when compared with other memory technologies (such as SRAM and DRAM devices). Furthermore, because memristors devices are based on conductance modulation to represent logic states ('1' or ON and '0' or OFF states), a large ON/OFF conductance ratio is essential for reliable data access. In the same fashion, having high conductance in both ON/OFF states consumes considerable current to be used in order to read the stored data. This can present a power consumption problem that can restrict memristor technologies for use in low power devices. Therefore, an enhanced nanoelectronic memristor device would be desirable.

SUMMARY OF THE INVENTION

This invention relates to a nanoelectronic memristor device that can store data as (1) the change in the magnetic state, and/or (ii) change in the conductance.

This invention also relates to a method of fabricating a nanoelectronic memristor device that includes a first electrode and a layer of oxygen-vacancy-rich metal oxide deposited upon a surface of the first electrode. A layer of oxygen-rich/stochiometric metal oxide is deposited upon a surface of the oxygen-vacancy-rich metal layer that is opposite from the first electrode, with at least one of the oxygen-rich/stochiometric metal oxide and oxygen-vacancy-rich metal oxide layers being doped with one of a magnetic and a paramagnetic material. The device further includes a second electrode adjacent to a surface of the oxygen-rich/stochiometric metal oxide that is opposite from the oxygen-rich metal layer.

This invention further relates to a method for fabricating a nanoelectronic memristor device that includes providing a first electrode, then depositing a layer of an oxygen-vacancy-rich metal oxide upon the first electrode. A layer of an oxygen-rich/stochiometric metal oxide is then disposed upon a surface of the oxygen-vacancy-rich metal oxide layer that is opposite from the first electrode. The oxygen-vacancy-rich metal oxide layer and/or the oxygen-rich/stochiometric metal oxide layer is doped with a magnetic material or a paramagnetic material. Finally, a second electrode is deposited upon a surface of the oxygen-rich metal layer that is opposite from the layer of oxygen-rich/stochiometric metal oxide.

Various aspects of this invention will become apparent to those skilled in the art from the following detailed description of the preferred embodiments, when read in light of the accompanying drawings.

BRIEF DESCRIPTION OF THE DRAWINGS

FIG. 1 is an enlarged schematic view of a prior art nanoelectronic memristor device.

FIG. 2 is an enlarged schematic view of a nanoelectronic memristor device having layers that are doped with a dilute magnetic semiconductor material.

DETAILED DESCRIPTION OF THE PREFERRED EMBODIMENTS

Figure 3:
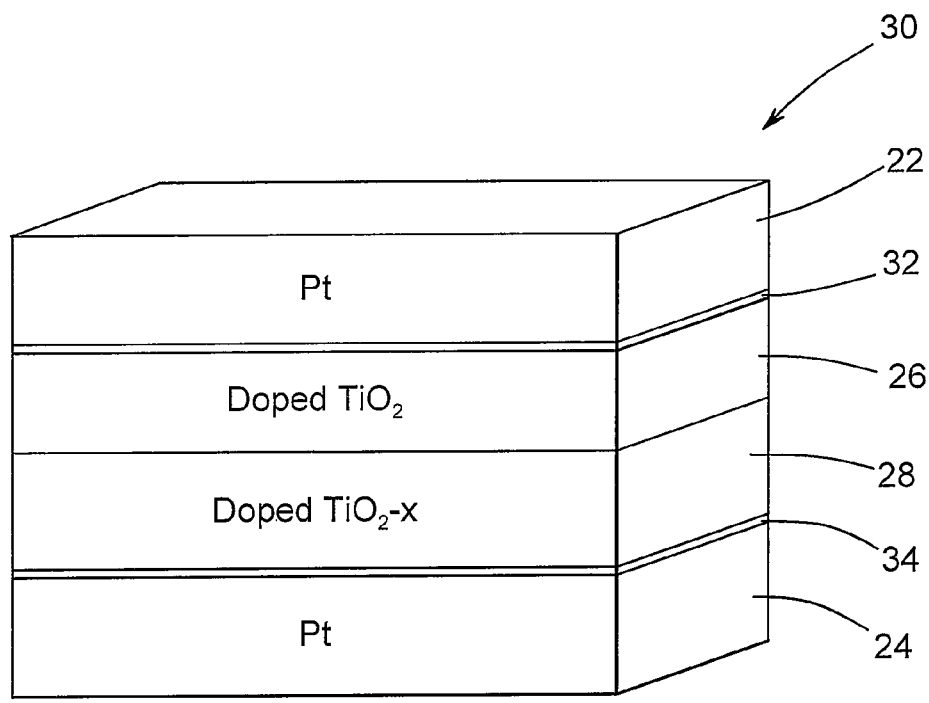
FIG. 3 is an enlarged schematic view of an alternate embodiment of the nanoelectronic memristor device shown in FIG. 2.

As described herein, a magnetic and/or a paramagnetic doping material (such as, for example, manganese, cobalt, iron, nickel, or chromium) is added to one or both of transition metal oxide layers of a nanoelectronic memristor device. The transition metal oxide layers may, for example, be formed from titanium dioxide, hafnium dioxide, strontium titanium oxide, zirconium dioxide, zinc oxide, tantalum oxide, hafnium lanthanum oxide, or hafnium aluminum oxide. The doping with the magnetic and/or a paramagnetic doping material achieves the formation of a dilute magnetic semiconductor oxide material, where change in magnetization can be achieved as a function of the oxygen vacancies concentration in the magnetically doped layer. Under an applied bias, the oxygen-vacancies can be injected from vacancy-rich metal oxide into the oxygen-rich/stochiometric metal oxide. This changes the oxygen vacancy concentration in the magnetic metal doped layer and, thus, results in the change in the magnetic state of the device as a function of the voltage. Furthermore, the injected oxygen vacancies increase the trap states or alter the interface between the metal/metal oxide, which alters the electrical conductance of the device. Therefore, both the magnetic state and the electrical conductance can be changed in this configuration under the applied bias.

This change in the magnetic state and electrical conductance is analog in nature, which extends the application of these devices not only for digital or multi-bit non-volatile data storage, but also in the areas of neural reconfigurable circuits, where nanoelectronic devices can be used as biologically-inspired synapse. Doping with species, such as manganese and cobalt, can provide a large ON/OFF conductance ratio by reducing the OFF state conductance, which is a desirable attribute for digital switching. Additionally, because the OFF state now has a lower conductance, the current required for reading the OFF state is also lower, reducing the overall power consumption. Furthermore, a dilute semiconductor material also allows for a faster switching of the device, which allows faster access to the data stored when compared to common memristor devices.

The ability to alter the magnetic state, as well as the electrical conductive state, with applied bias provides an opportunity for seamless heterogeneous integration of spin-based and charge-based devices.

Referring again to the drawings, there is shown in FIG. 2 a nanoelectronic memristor device 20. The device 20 includes two metal electrodes 22 and 24 that can be made of metals such as (but not limited to) tungsten, platinum, titanium nitride, nickel, and ruthenium. Thus, while the illustrated electrodes 22 and 24 are shown in FIG. 2 as being formed from platinum, they may alternatively be formed from other metals. Between the electrodes 22 and 24 are two intermediate layers 26 and 28 that form the device. The first layer 26 is made of a suitable oxygen-rich/stochiometric material, such as, for example, titanium dioxide, hafnium dioxide, zinc oxide, indium oxide, or tin oxide. The second layer 28 can be any oxygen-vacancy-rich (i.e., oxygen-deficient) material, such as, for example, oxygen-vacancy-rich titanium oxide. The first and second layers 26 and 28 are doped with the addition of a magnetic and/or paramagnetic material such as (but not limited to) manganese, cobalt, iron, nickel, chromium, or other dilute magnetic semiconductor oxide materials. While both of the layers 26 and 28 are shown as being doped in FIG. 2, it will be appreciated that the invention may also be practiced with only one of the layers 26 or 28 being doped. The thickness of the layers 26 or 28 and concentration of the doping material within the layers 26 or 28 will be described below.

An alternate embodiment 30 of the present invention is shown in FIG. 3, where components that are similar to components shown in FIG. 1 have the same numerical identifiers. The alternate embodiment 30 includes a first thin layer of a magnetic and/or a paramagnetic material 32 between the upper electrode 22 and the upper intermediate layer 26. The device 30 also includes a second layer 34 of a magnetic and/or a paramagnetic material between the lower electrode 24 and the lower intermediate layer 28. As will be described below, the inclusion of the thin layers 32 and 34 of a doping material allows the fabrication of the dilute magnetic semiconductor oxide material that improves the performance of the device 30 over that of prior art memristor devices. The thin layers 32 and 34 of the doping material can include (but are not limited to) manganese, cobalt, iron, nickel, chromium, or other dilute magnetic semiconductor oxide material materials, As with the device shown in FIG. 2, the alternate embodiment 30 also may be practiced with only one of the layers 26 or 28 doped (not shown). The thickness of layers of doping material 32 and 34 will be described below.

Figure 4:
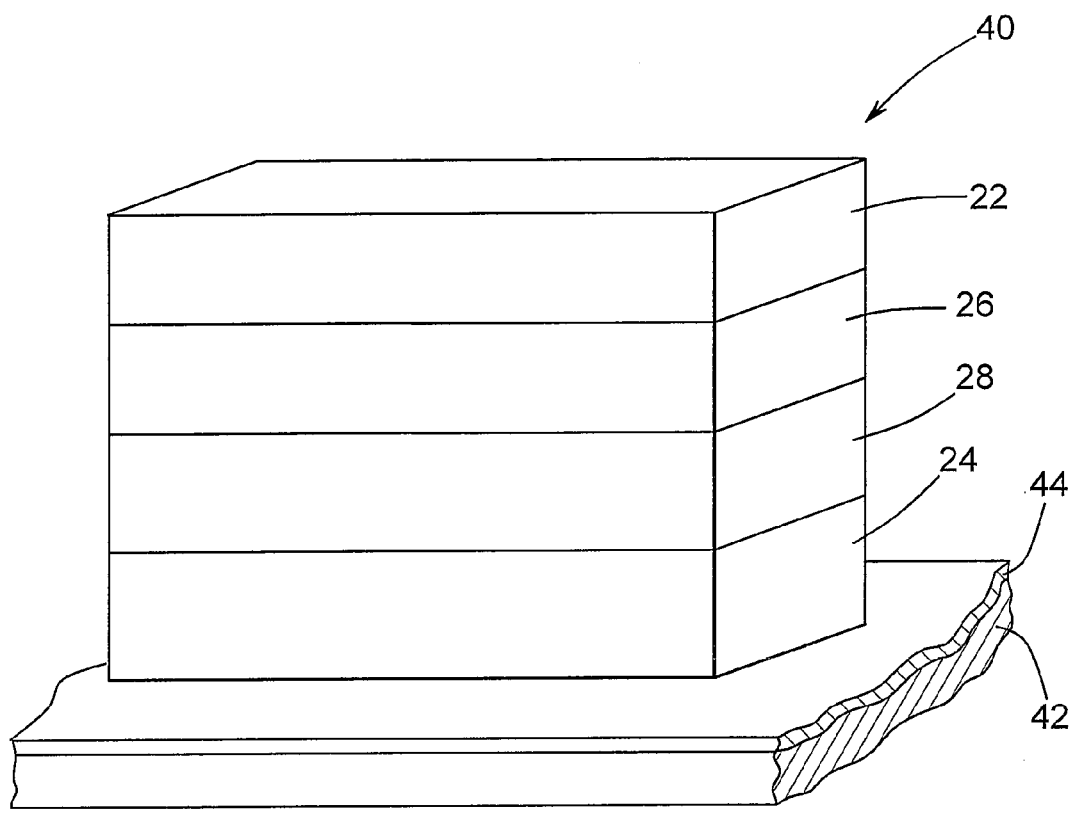
FIG. 4 is an enlarged schematic view of the device shown in FIG. 2 mounted on a substrate.

The device also may be fabricated as a metal-insulator-metal structure, as shown at 40 in FIG. 4. Components shown in FIG. 4 that are similar to components shown in FIGS. 2 and 3 have the same numerical identifiers. In FIG. 4, the structure shown in FIG. 2 is disposed upon a bottom electrode 42. A layer of insulator material 44 is placed between the bottom electrode 42 and the lower electrode 24 of the device. The bottom electrode 42 can be created by depositing metals (such as tungsten, platinum, and ruthenium, for example) using deposition techniques such as (but not limited to) magnetron sputtering followed by standard photo-lithography or e-beam pattering. Again, it will be appreciated that the invention also contemplates mounting the structure of device 30 upon a bottom electrode with an isolation layer 44 separating the bottom electrode from the lower electrode of the device 30 (not shown).

Figure 5:
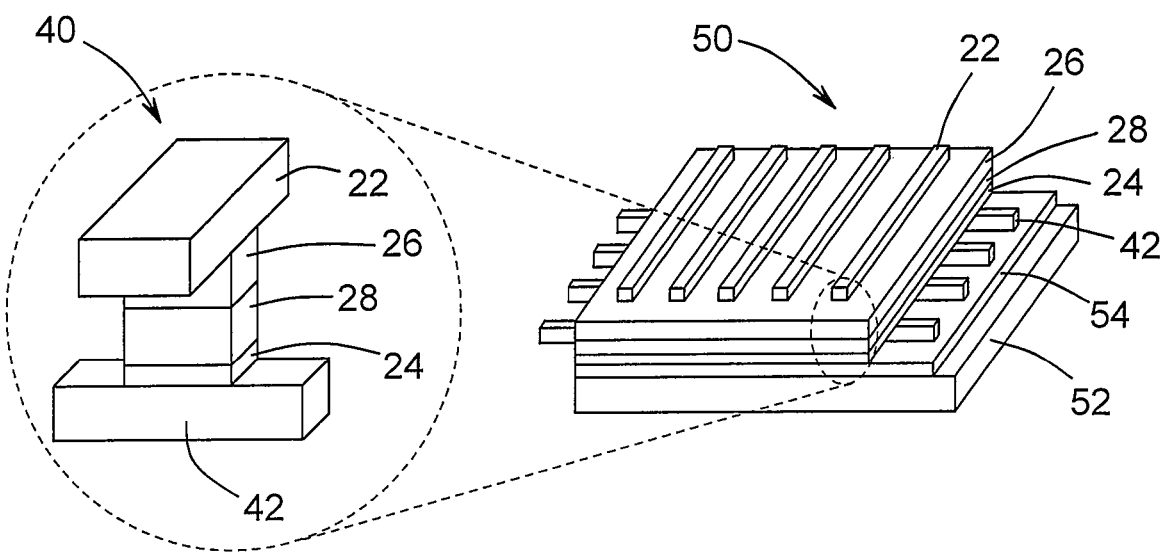
FIG. 5 is an enlarged schematic view of an alternate embodiment of the device shown in FIG. 3 that is fabricated in a cross-bar structure.

As illustrated in FIG. 5, the components may be fabricated in a cross-bar configuration 50. Components shown in FIG. 4 that are similar to components shown in FIGS. 2 and 3 have the same numerical identifiers. The configuration 50 includes a substrate 52 that carries the layers of the device 40, wherein the upper and lower electrodes 40 and 42 are formed as bars. The substrate 52 may be a regular silicon wafer, making it compatible with current CMOS technology or any other substrate. An additional layer 54, similar to that shown at 44 in FIG. 4, is optional and is intended to serve as an electrical isolation layer between the lower electrode 24 and the substrate 52. The electrical isolation layer 54 may be needed if the material forming the substrate 52 is not a good electrical isolator. The isolation 54 layer can be made by depositing or growing a dielectric material, such a silicon dioxide or other material, using techniques such as, for example, chemical vapor deposition or by magnetron sputtering. Also, the layer of insulator material 44 may be placed between the bottom electrode 42 and the lower electrode 24 of the device 40 (not shown). While the structure of the device 40 is as shown in FIG. 5, it will be appreciated that the devices 20 and 30 may be mounted upon a substrate with the addition of an isolation layer, if needed (not shown).

Because the magnetic flux within a memristor device at a given time depends on the history of the charge, the current behavior of the device is affected by the amount of charge that previously passed through it. The ability to modify the behavior of the device according to its previous state can be seen as a memory effect that can be implemented in memory devices. However, in order for memristor devices to be classified as non-volatile memory devices, a minimum of ten years of data retention is required. The illustrated device can meet this non-volatile classification data retention requirement because the oxygen vacancy ions will only drift under an applied electric field. Therefore, if the conduction of the overall device has been set to either a high conductance state (ON) or a low conductance state (OFF) and the potential is removed from its electrodes, the oxygen vacancy ions will not be in the presence of any electric field that will force them to drift. Without the ion drift, the boundary between the oxygen-rich material and the oxygen-vacancy-rich material will remain immobile, and the conductance (and thereby the resistance) of the overall device will stay unchanged. The requirement for the presence of an electric field order to alter the device conductivity by ion drift allows removal of the potential to the device without losing its conduction state. In other words, no electrical power is required to retain the entered data.

Memristor devices offer several advantages and eliminate the limitations of flash technology devices. Flash memory device performance is highly dependent on the quality of the oxide used for tunneling. Because this oxide is not used in memristor devices, this limitation is eliminated. Also, flash memory devices typically need a thin tunnel oxide to allow tunneling. However, making the tunnel oxide too thin will increase leakage current due to field-assisted electron emission, which may lead to charge retention problem. This problem is not present in memristors. In fact, the smaller the device, the more memristance effect will be present, increasing the ability of the device to remember its previous state. Additionally, constantly writing and erasing a flash memory device will result in an eventual degradation of the tunnel oxide, where trapped charges will build-up, allowing trap-assisted tunneling and reducing the ability of the floating gate to store any charge. Again, because no tunnel oxide is used in the device, it will allow for a longer lifetime than current flash technology devices. Scalability is also improved when using memristor devices because memristor are two-terminal devices, while flash memory devices require three terminals to operate. Reducing the amount of terminals in the device significantly reduces the area required per device, allowing a much high integration density. The higher integration density is one of the main attractions of this technology because it will allow semiconductor companies to fabricate higher data capacity memory at a lower price. Furthermore, memristor devices do not use a channel to accelerate electrons. In flash memory devices, such channels restrict the shrinking of the channel length and the thickness of the tunnel oxide in flash memory technology due to the requirements of sufficient kinetic energy to achieve hot electron injection. For all of the above reasons and many others, memristors devices will allow the non-volatile memory technology to evolve, thereby satisfying future demands for data storage.

The lower OFF-state conductance obtained with manganese doping offers a great performance advance over prior art devices without manganese doping in terms of power consumption. When this device is used as a memory device, the reading process will be carried out by monitoring the current magnitude as a response of a voltage-read to determinate the conduction state of the device, which is related to the data by either a high conductance state ('1' or ON) or a low conductance state ('0' or OFF). During the reading of the OFF-state, ideally a zero current is preferred to be conducted so no power is dissipated by the device. In other words, the manganese doping of the titanium oxide layer indeed helps to reduce the power consumption of the memristor devices.

Also described is a method of fabricating the devices shown in FIGS. 2 through 5. The method includes integration of the dilute magnetic semiconductor oxide material in the transition metal oxide stack where the dilute magnetic semiconductor oxide material can be formed by:

(1) depositing a thin layer of a magnetic metal (such as, for example, manganese, cobalt, iron, nickel, or chromium) at the bottom electrode interface and/or at the top electrode interface; or (2) incorporating magnetic doping with or without a concentration gradient in the bottom oxygen-deficient transition metal oxide and/or the upper oxygen-rich layer by reactive co-sputtering, atomic layer deposition, metal-organic chemical vapor deposition, ion implantation, or other known methods.

Thus, the method of fabricating contemplates doping of the transition oxide layers by one of two alternative procedures.

Figure 6:
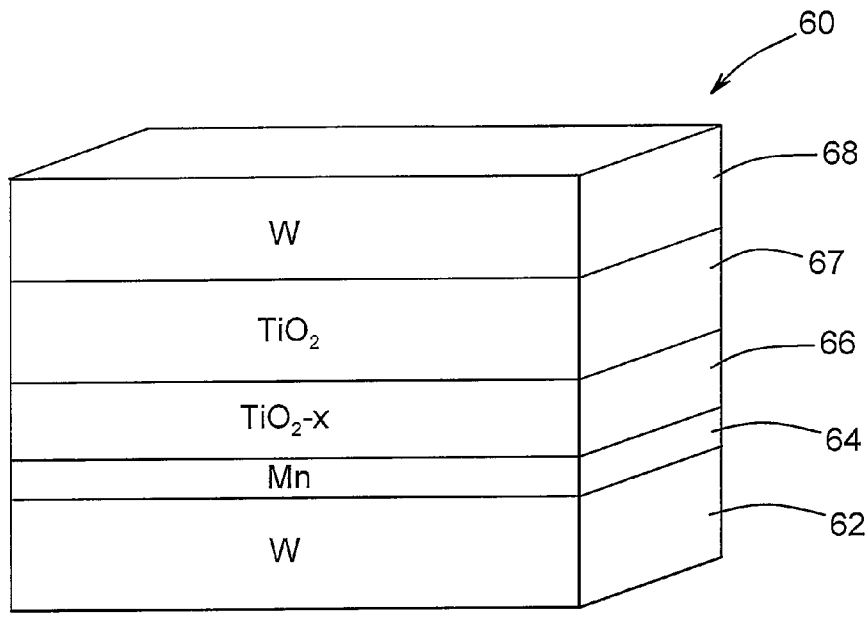
FIG. 6 is an enlarged schematic view of another alternate embodiment of the device.
Figure 7:
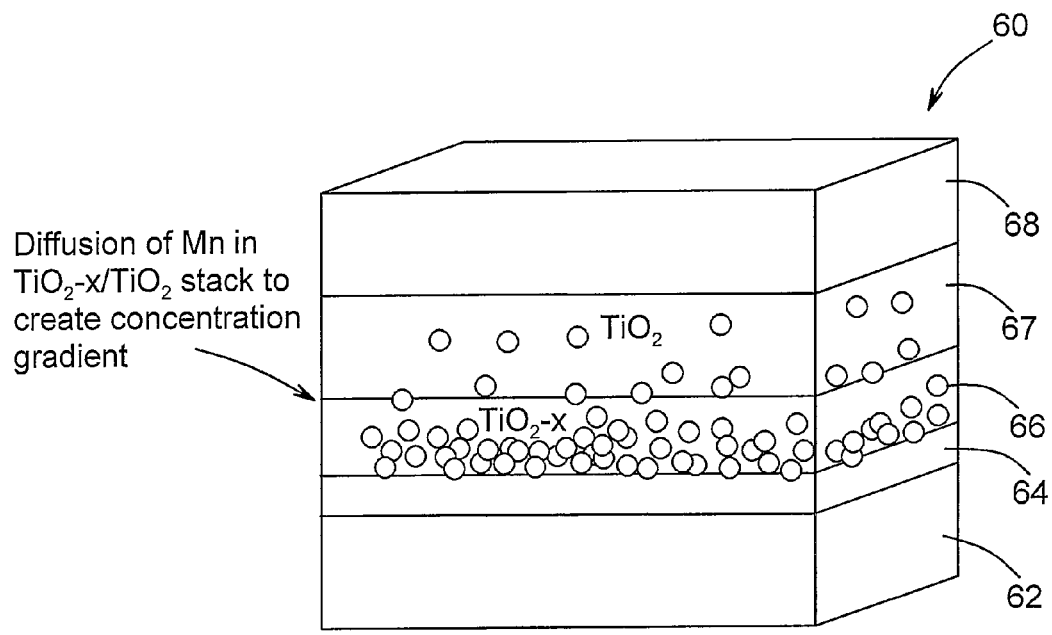
FIG. 7 illustrates the doping process utilized to form the device shown in FIG. 6.

The first doping procedure involves manganese doping by manganese diffusion and is illustrated by the device shown 60 shown in FIG. 6, where components that are similar to components shown in the other drawings have the same numerical identifiers. The technique of manganese doping by manganese diffusion is based upon the metal diffusion than occurs when high temperature is applied to the sample. After a lower electrode 62 is fabricated, a thin layer made of the magnetic and/or paramagnetic material 64 is deposited by a technique, such as magnetron sputtering. Then an oxygen-vacancy-rich transition metal layer 66 is deposited by magnetron sputtering in a low concentration of oxygen at high temperature. The low concentration of oxygen allows the presence of oxygen vacancies. Next, a transition metal oxide layer 67 that is rich in oxygen is deposited upon the oxygen-vacancy-rich layer 66 by magnetron sputtering, but using a higher oxygen concentration in order to avoid oxygen vacancies. The high temperature during this deposition process allows both the bonding of the oxygen atom to the metal atoms to form the transition metal material and the diffusion of the magnetic and/or paramagnetic material into the layers 66 and 67, as shown in FIG. 7. This process allows the formation of a dilute magnetic semiconductor material, which improves the switching behavior of the devices. Finally, an upper electrode 68 is deposited upon the upper surface or the oxygen-rich layer 67.

Standard fabrication techniques can be used to fabricate memristor devices as described above. The process begins by selecting the appropriate substrate. In this case, the substrate serves as structural support only. Because silicon wafers are the standard substrate used in CMOS fabrication, a blank silicon wafer can be selected, although other materials can also be explored. The silicon wafers used during the process can have a thickness of about 5251 μm. The silicon wafers can be cleaned by deep submersion in a solution of hydrofluoric acid diluted in distilled water to a water:hydrofluoric acid ratio of about 50:1 for ten seconds, followed by two minutes of distilled water rinsing, in order to free these wafers of any contaminant that could affect the fabrication results.

In order to reduce fabrication costs, both the lower and upper electrodes 62 and 68 of the device 60 can be made using tungsten, rather than platinum. Tungsten is easier to pattern than platinum, can be deposited using conformal process such as atomic layer deposition or chemical vapor deposition, is thermally stable, and demonstrates better adhesion with the metal oxides. The lower electrode 62 can consist of a tungsten layer with a thickness of about 1000 Å. However, the lower electrode 62 may be thinner or thicker. Preferably, the lower electrode 62 has a thickness that falls within a range of 50 Å to 1000 Å. The lower electrode layer 62 can be deposited over the entire silicon wafer by RF (radio frequency) magnetron sputtering. The thickness of this layer can be controlled by calculating the deposition time with a previous characterization of the deposition rate of this material under a pressure of 5 mTorr, a temperature of 19° C., and an RF magnetron power of 100 W.

A thin manganese layer 64 having a thickness of about 30 Å can be deposited right after the lower tungsten electrode 62 is formed. While a thickness of 30 Å can be used for the manganese layer 64, it will be appreciated that the manganese layer 64 may be thinner or thicker. Preferably, the manganese layer 64 has a thickness that falls within a range of 10 Å to 100 Å. The manganese layer 64 can be deposited by using the same RF magnetron sputtering system used to deposit the lower electrode 62. The deposition time required for depositing manganese layer 64 can be calculated by using a previously characterized deposition rate of this material under a pressure of 5 mTorr, a temperature of 19° C., and an RF magnetron power of 100 W. After the manganese layer 64 is deposited, the fabrication process can be continued as explained below. As a result, a manganese blanket layer 64 will lay between the tungsten lower electrode 62 and a titanium dioxide layer 66 as shown in FIG. 6. The actual doping is obtained during the deposition of titanium dioxide and oxygen-vacancy-rich titanium oxide. The titanium oxide layers can be deposited while heating the sample at 300° C. This heat provides sufficient energy to allow the diffusion of manganese atoms into both titanium oxide layers, as illustrated in FIG. 7. This doping technique allows the incorporation of a manganese doping gradient in the device structure. The manganese concentration can preferably range from 3%-20% in the metal oxide film.

The oxygen-deficient titanium oxide layer 66 can be obtained by reactive sputtering of titanium in an oxygen ambient environment. A titanium target can be used for the sputtering process while infusing a gas mixture of about 11% oxygen to argon ratio into the sputtering chamber. During the deposition, the temperature can be maintained constant at 300° C. in order to allow the titanium to react with oxygen and oxidize while being deposited over the previous tungsten bottom electrode and hard masking. Using a low oxygen flow rate (1.2 sccm) allows the formation of titanium oxide with lower oxygen concentration than titanium dioxide. As a result, oxygen-deficient titanium oxide can be obtained. The deposition time required for depositing the 1100 Å thick oxygen-deficient titanium oxide layer can be a pressure of 5 mTorr, a temperature of 300° C., and an RF magnetron power of 200 W. While a thickness of 1100 Å can be used for the oxygen-deficient titanium oxide layer 66, it will be appreciated that the layer may be thinner or thicker. Preferably, the oxygen-deficient titanium oxide layer 66 has a thickness that falls within a range of 50 Å to 1500 Å.

Similar to the oxygen-deficient titanium oxide deposition, a 240 Å thick metal oxide layer 67 can be deposited by reactive sputtering of titanium in an oxygen-ambient environment. While a thickness of 240 Å can be used for the metal oxide layer 67, it will be appreciated that the layer may be thinner or thicker. Preferably, the metal oxide layer 67 has a thickness that falls within a range of 20 Å to 500 Å. A richer concentration of oxygen can be used during the sputtering. A 25% ratio of oxygen to argon can be injected into the sputtering chamber while keeping a constant temperature of 300° C. A higher oxygen flow rate of 2.4 sccm allows for complete oxidation of titanium, forming titanium dioxide. The transition metal oxide layer 67 can be deposited on top of the previous oxygen-deficient titanium oxide layer 66. The order of deposition (namely, the titanium dioxide layer 67 on top of the oxygen-deficient titanium oxide layer 66 and not in the opposite way) protects the oxygen-deficient titanium oxide layer 66 from any further oxidation that could happen if the titanium dioxide layer is exposed to the air. However, any sequence of film metal oxide deposition can be adopted based on patterning and device integration scheme.

An upper electrode pattern (not shown) can be used to define the area of the device and to separate individual devices formed upon the same wafer. The pattern can be selected to have squares electrodes with side length of 200 μm, 100 μm, 50 μm and 251 μm. However, other side lengths can be utilized. In particular, the devices will be of particular importance for highly scaled dimensions less than 22 nm or smaller. The pattering technique selected for the device fabrication can be lift-off, where a metal layer is used to cover a pattered photo-resist layer and, when the photo-resist is removed, only the metal with the shape of the electrodes remain. Alternately, an etching technique can be used with an etching agent that chemically reacts with the metal electrode in order to remove it in the areas where metal is undesired. If the etching technique is used, the etching agent should be carefully selected to etch only the metal used for the electrodes and to not react with the titanium dioxide layer below the electrodes. Similar to the lower electrode 62, the upper electrode 68 can be formed having a thickness of 1000 Å. While a thickness of 1000 Å can be used for the upper electrode 68, it will be appreciated that the upper electrode may be thinner or thicker. Preferably, the upper electrode 68 has a thickness that falls within a range of 10 Å to 1000 Å. In addition, the upper electrode 68 can be capped with polycrystalline silicon material for ease in integration of nanoscale devices and commercial production.

While the described procedure for fabricating the device 60 described above and shown in FIG. 6 includes a single manganese layer 64 adjacent to the lower electrode 62, it will be appreciated that the invention also may be practiced by depositing a single manganese layer adjacent to the upper electrode (not shown) or by depositing two manganese layers with each layer adjacent to one of the electrodes (not shown).

The second doping procedure involves co-sputtering the metal used to form the transition metal oxide together with the magnetic/paramagnetic material in an oxygen environment at high temperature. With this procedure, doping can be carried out by embedding the particles of the magnetic/paramagnetic material into one or both of the transition metal oxide layers, instead of relying on the diffusion of the magnetic or paramagnetic material due to the high temperature application, as in the first procedure. The device 20 shown in FIG. 2 can be formed with this procedure.

Fabrication can begin with formation of a lower electrode (by depositing a metal such as, for example, tungsten, platinum, and ruthenium) using deposition techniques such as, but not limited to, e-beam or magnetron sputtering upon an appropriate substrate.

Next, the intermediate titanium oxide layers can be formed. With the co-sputtering technique, a manganese target can be used to co-sputter manganese in conjunction to titanium in an oxygen ambient environment at 300° C. The process embeds manganese atoms along with the titanium oxide materials. The sputtering process can be performed using the same parameters as the ones described above to deposit the oxygen-deficient titanium oxide and titanium dioxide. However, manganese can also be sputtered at the same time, but with a reduced RF magnetron power to achieve a concentration of 5% manganese to titanium oxide material ratio. By controlling the manganese sputtering power, it is also possible to create a doping gradient similar to the one achieved by the manganese diffusion technique. While a concentration of 5% manganese to titanium oxide material ratio is desirable, it will be appreciated that the invention also may be practiced with other ratios. Preferably, the ratios fall within a range of 3% to 25%.

After the dilute magnetic semiconductor material is formed in one or both of the transition metal oxide layers, the upper electrode can be fabricated in a manner similar to the fabrication of the lower electrode by depositing metals such as, for example, tungsten, platinum, and ruthenium, and by using deposition techniques such as (but not limited to) e-beam or magnetron sputtering followed by photo-lithography patterning.

Figure 8:
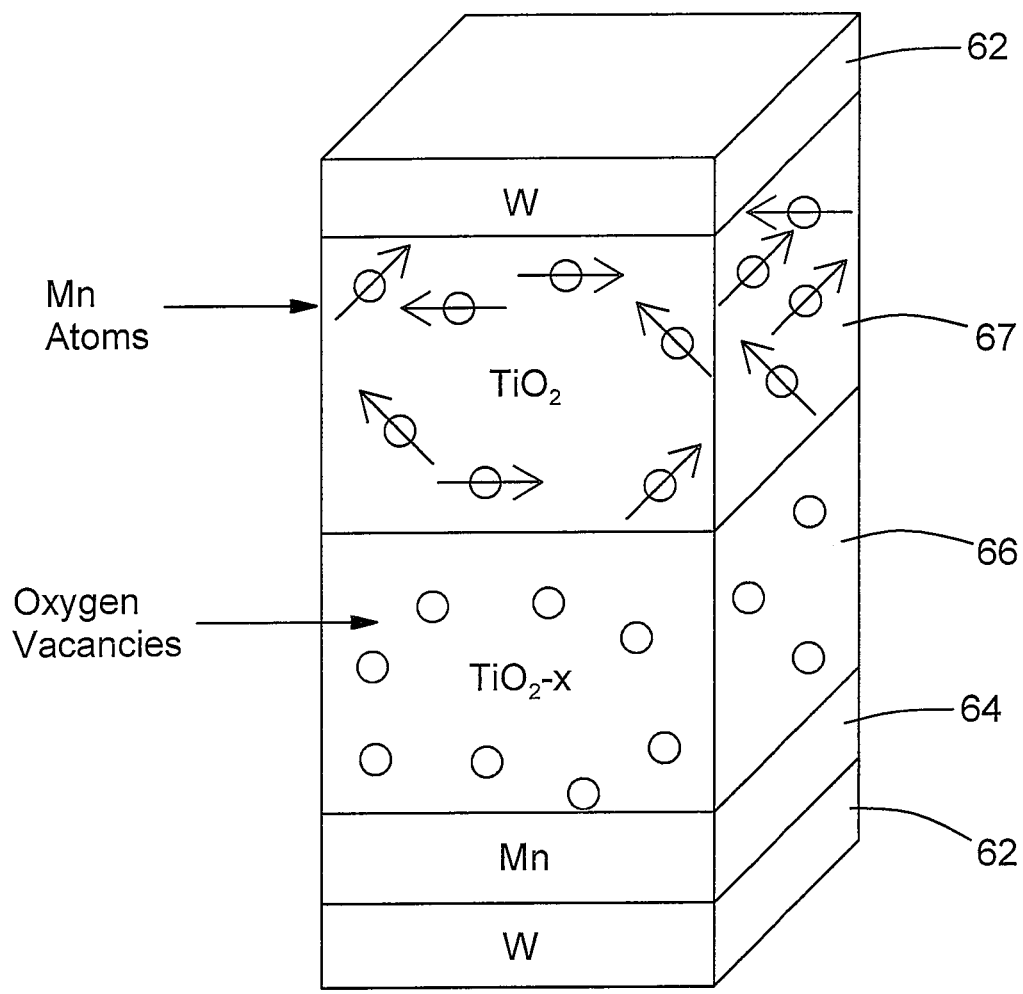
FIG. 8 is an enlarged schematic view of the device shown in FIG. 6 with one of the intermediate layers behaving as a paramagnetic material.
Figure 9:
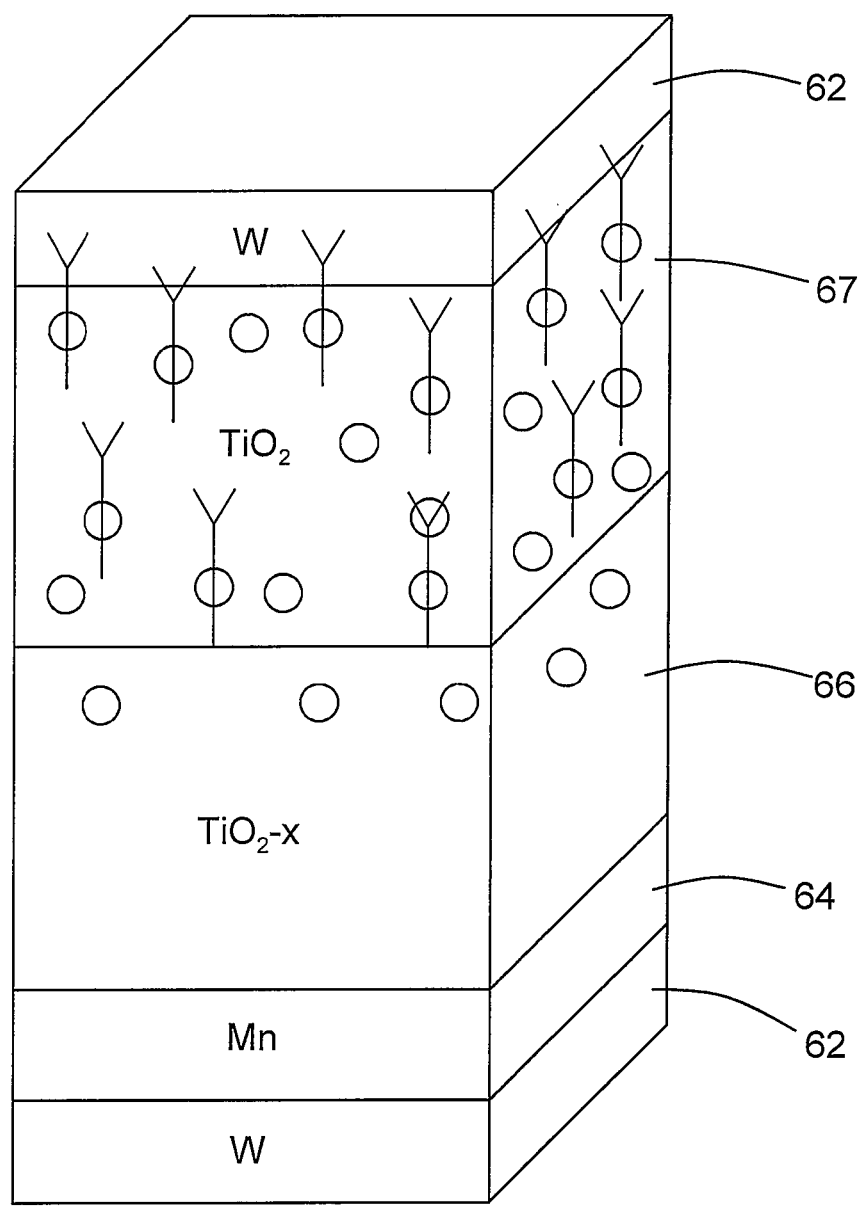
FIG. 9 is an enlarged schematic view of the device shown in FIG. 6 with one of the intermediate layers behaving as a ferromagnetic material.

Two effects can result from the use of manganese doping in titanium oxide. The first effect is a reduction of the off-state current of the memristor device. The second effect is a magnetic interaction between the manganese atoms and the movement of oxygen vacancies. By adding manganese to both layers of titanium oxide during the sputtering system at high temperature in an oxygen ambient, the manganese can oxidize creating manganese oxide. Because manganese oxide behaves more like an insulator, the entire conductivity of the device may be reduced, which is especially important in the off state of the memristor devices in order to reduce power consumption and improve the conductance difference between the on and off states. The use of magnetic materials to dope transition metal oxides can create a dilute magnetic semiconductor oxide material where there is a interaction between the magnetic species and the oxygen vacancies in the material. By careful control of the concentration of magnetic species and oxygen vacancies, the magnetic state of the device can be altered to provide an alternate methodology to store the data in non-volatile fashion. FIG. 8 shows that in the absence of oxygen vacancies, the manganese atoms will remain mostly magnetically disoriented, which is observed as a paramagnetic behavior. However, in the presence of oxygen vacancies, which occurs when the oxygen vacancies migrate from the lower oxygen-deficient titanium oxide layer 66 to the upper titanium dioxide layer 67 as shown in FIG. 3, the manganese atoms will become magnetically oriented, which can be observed as ferromagnetic behavior. In other words, the interaction of the oxygen vacancies movement in a memristor device can change the magnetic characteristics of the manganese-doped titanium oxide. This is also true when the metal oxide layers are formed from any combination of other materials, as well as from a hafnium dioxide, zinc oxide, or a titanium dioxide/hafnium dioxide stack.

Resistive random access memory/memristive devices can be fabricated by incorporating magnetic doping with or without a concentration gradient in oxygen-deficient titanium oxide/titanium dioxide stacks or any other combination of transition metal oxides, such as oxygen-deficient titanium oxide/hafnium dioxide, oxygen-deficient titanium oxide/zinc oxide, or zinc oxide/hafnium dioxide, as shown in FIGS. 3 and 4. Magnetic doping preferably consists of manganese. However, other magnetic dopants, such as nickel, iron, chromium, or cobalt, can also be utilized. An important feature lies in engineering the doping profile of the magnetic dopant. Films can be deposited using RF magnetron sputtering.

The principle and mode of operation of this invention have been explained and illustrated in its preferred embodiments. However, it must be understood that this invention also may be practiced otherwise than as specifically explained and illustrated without departing from its spirit or scope.

What is claimed is:

1. A nanoelectric memristor device comprising
a first electrode;
a layer of oxygen-vacancy-rich metal oxide deposited upon a surface of said first electrode;
a layer of oxygen-rich/stoichiometric metal oxide deposited upon a surface of said oxygen-vacancy-rich metal oxide layer that is opposite from said first electrode, at least one of said oxygen-vacancy-rich metal oxide and oxygen-rich/stoichiometric metal oxide layers being doped with one of a magnetic and a paramagnetic material; and
a second electrode adjacent to a surface of said oxygen-rich/stoichiometric metal oxide layer that is opposite from said oxygen-rich/stoichiometric metal oxide layer.

2. The device according to claim 1 wherein both of said oxygen-vacancy-rich metal oxide layer and said oxygen-rich/stoichiometric metal oxide layer are doped with one of said magnetic material and said paramagnetic materials.

3. The device according to claim 1 wherein said one of said magnetic and said paramagnetic materials is one of manganese, nickel, iron, chromium, and cobalt.

4. The device according to claim 1 wherein said one of said magnetic and said paramagnetic materials has a percent concentration within said doped layer within a range of 3% to 25%.

5. The device according to claim 2 wherein said oxygen-vacancy-rich metal oxide layer is formed from one of titanium dioxide, hafnium dioxide, strontium titanium oxide, zirconium dioxide, and zinc oxide, and further wherein said oxygen-rich/stoichiometric metal oxide layer is formed from one of titanium dioxide, hafnium dioxide, zinc oxide, indium oxide, or tin oxide.

6. The device according to claim 1 wherein said first and second electrodes are formed from one of tungsten, platinum, titanium nitride, tantalum nitride, nickel, and ruthenium.

7. The device according to claim 1 wherein said first electrode is carried upon a substrate.

8. The device according to claim 7 further including a layer of insulating material disposed between said first electrode and said substrate.

9. The device according to claim 1 wherein each of said oxygen-vacancy-rich metal oxide and oxygen-rich/stoichiometric metal oxide layers has a thickness within a range of 20 Å to 1500 Å.

* * * * *